(12) United States Patent
Ziener

(10) Patent No.: US 10,534,152 B2
(45) Date of Patent: Jan. 14, 2020

(54) METHOD FOR PRODUCING AN OPTICAL ELEMENT COMPRISING MICRO-OPTICAL STRUCTURES, ARRANGEMENT AND MEMBRANE UNIT

(71) Applicant: JENOPTIK Optical Systems GmbH, Jena (DE)

(72) Inventor: Christian Ziener, Jena (DE)

(73) Assignee: JENOPTIK Optical Systems GmbH, Jena (DE)

( * ) Notice: Subject to any disclaimer, the term of this patent is extended or adjusted under 35 U.S.C. 154(b) by 344 days.

(21) Appl. No.: 15/320,964

(22) PCT Filed: Jun. 26, 2015

(86) PCT No.: PCT/EP2015/001297
§ 371 (c)(1),
(2) Date: Dec. 21, 2016

(87) PCT Pub. No.: WO2015/197195
PCT Pub. Date: Dec. 30, 2015

(65) Prior Publication Data
US 2017/0160510 A1  Jun. 8, 2017

(30) Foreign Application Priority Data

Jun. 26, 2014 (DE) .................. 10 2014 009 285

(51) Int. Cl.
*G02B 7/00* (2006.01)
*G02B 5/18* (2006.01)
(Continued)

(52) U.S. Cl.
CPC ........... *G02B 7/008* (2013.01); *G02B 5/1847* (2013.01); *B81C 1/00015* (2013.01);
(Continued)

(58) Field of Classification Search
CPC ........... H01L 21/6835; H01L 2924/351; H01L 2924/3511; G02B 7/008; B81C 1/00015; B81C 1/00182
See application file for complete search history.

(56) References Cited

U.S. PATENT DOCUMENTS 5,281,834 A * 1/1994 Cambou ............. H01L 21/2007
257/183
8,754,505 B2   6/2014 Colnat
(Continued)

FOREIGN PATENT DOCUMENTS

WO   WO 2006/073829 A2   7/2006

*Primary Examiner* — Carson Gross
(74) *Attorney, Agent, or Firm* — Muncy, Geissler, Olds & Lowe, P.C.

(57) ABSTRACT

The approach presented here provides a membrane unit (105) comprising micro-optical structures (115), which comprises a wafer (110) as carrier basis of the micro-optical structures (115), an intermediate substrate (300) connected to the wafer (110), and a carrier (130) connected to the intermediate substrate (300), wherein the coefficients of thermal expansion of the wafer (100), of the intermediate substrate (300) and of the carrier (130) are dimensioned such that a coefficient of expansion of the carrier (130) is greater than a coefficient of expansion of the intermediate substrate (300) and the coefficient of expansion of the intermediate substrate (300) is greater than or equal to a coefficient of expansion of the wafer (110).

10 Claims, 4 Drawing Sheets

(51) Int. Cl.
    *B81C 1/00*       (2006.01)
    *H01L 21/683*     (2006.01)
(52) U.S. Cl.
    CPC ...... *B81C 1/00182* (2013.01); *H01L 21/6835* (2013.01); *H01L 2924/351* (2013.01); *H01L 2924/3511* (2013.01)

(56) References Cited

U.S. PATENT DOCUMENTS

2004/0063322 A1    4/2004  Yang
2009/0253245 A1   10/2009  Park
2012/0018855 A1*   1/2012  Colnat ................ H01L 21/2007
                                                          257/629

* cited by examiner

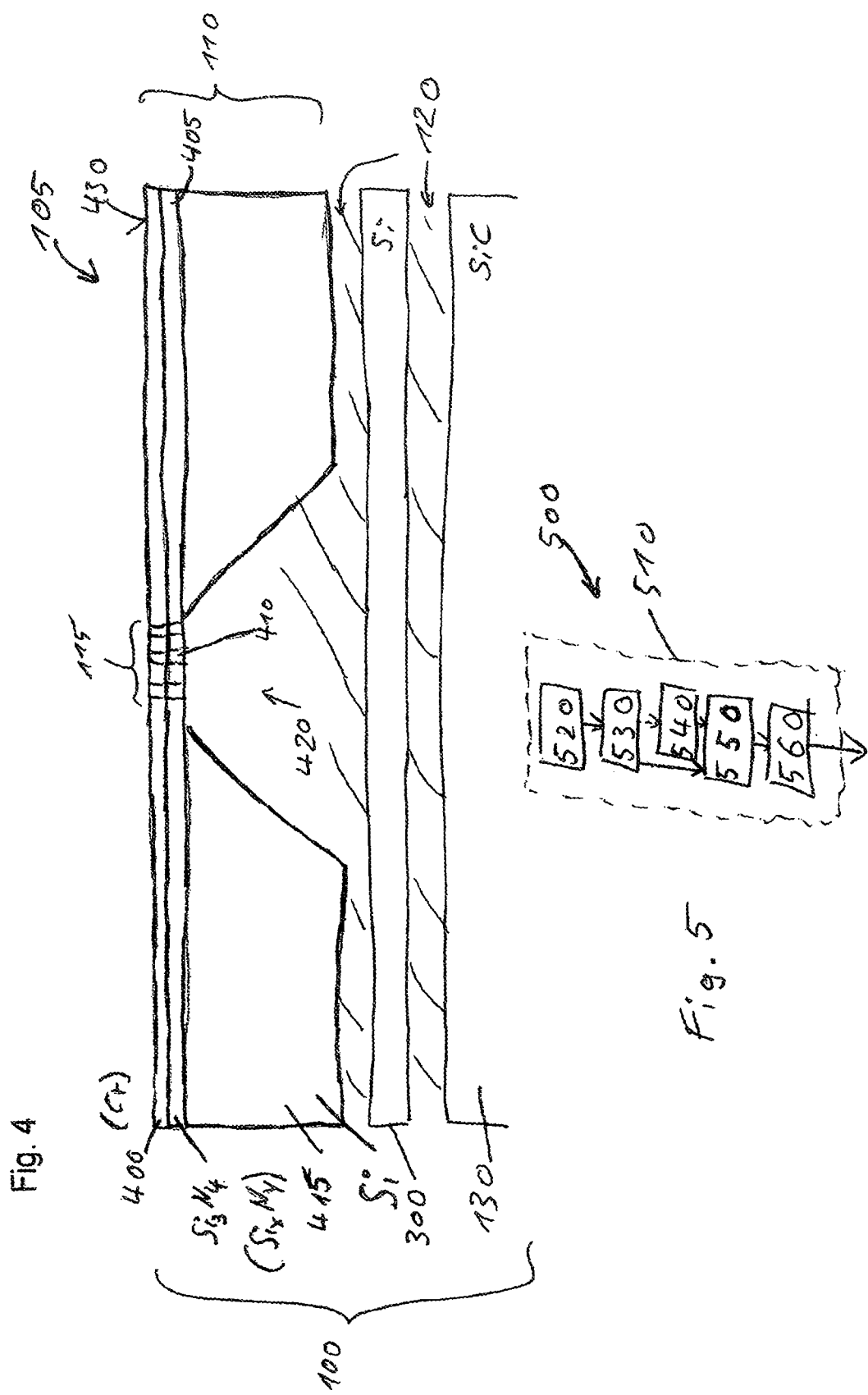

METHOD FOR PRODUCING AN OPTICAL ELEMENT COMPRISING MICRO-OPTICAL STRUCTURES, ARRANGEMENT AND MEMBRANE UNIT

CROSS REFERENCE TO RELATED APPLICATIONS

This application is a national stage of International Application No.: PCT/EP2015/001297, which was filed on Jun. 26, 2015, and which claims priority to German Patent Application No.: 10 2014 009 285.2, which was filed in Germany on Jun. 26, 2014, and which are both herein incorporated by reference.

The invention relates to a method for producing an optical element comprising micro-optical structures, to an arrangement of this type, and to a corresponding membrane unit.

So-called diffractive elements or arrangements are often used in optical systems. In this case, interference effects based on the wave properties of light are used in order to realize a desired field distribution at a specific location in the optical system. Both amplitude- and phase-influencing diffractive structures or combinations thereof are used. The applications of this type of diffractive "beam shaping" are very numerous nowadays; they range from generating a plurality of, as far as possible identical, beams (so-called beam splitters) through generating specific beam profiles (so-called beam shapers) for lasers to generating so-called off-axis illumination modes in semiconductor lithography, which are used for increasing the optical resolution capability of the optical system of these exposure apparatuses.

In the EUV spectral range (EUV=extreme ultraviolet), that is to say in the wavelength range of 5 nm to 30 nm, there are no genuinely transparent materials, that is to say that either diffractive structures are produced on a thin (which being thin thus exhibits only low absorption) membrane by applying structured absorber layers or the absorber layer is used as a hard mask for completely etching through the membrane.

These (carrier) membranes are often produced from $Si_XN_Y$, which is applied as a thin film on a silicon (Si) wafer, after which the silicon of the wafer itself is then removed in a dry- or wet-chemical method, such that only the thin (e.g. 100 nm thick) membrane remains, which is held at its edge by the wafer. By means of suitable process control during the coating of the wafer, a flatness of the self-supporting membrane which corresponds to the flatness of the wafer carrying it can be ensured.

In order to be able to integrate these membrane wafers into optical systems, they have to be applied to holders, which can be done e.g. by means of adhesives which cure at relatively high temperatures. During adhesive bonding in turn, the connection is formed without adhesive as intermediate substrate. In this case, appropriate carrier materials are primarily materials having a low CTE, for example ceramic, SiC or SiSiC.

In the case where the coefficients of thermal expansion of wafer and carrier are not identical, "bimetal"-like effects in this case result in a permanent warpage of the wafer and hence an unevenness of the micro-optical structures. Insofar as is known, no method exists for "smoothing" the wafers after the adhesive bonding process/bonding process or for increasing the flatness of the adhesively bonded wafer (and thus of the membranes) by means of a suitable arrangement.

In order to reduce the stress between materials which are adhesively bonded to one another and which have a different coefficient of thermal expansion or in order to prevent or to reduce warpage of the adhesively bonded wafer, various methods are described in the literature. U.S. Pat. No. 7,067,393 B2 describes e.g. an arrangement in which trenches are introduced into the substrate, said trenches subsequently being filled again with a different material. For the adhesive bonding of membrane wafers with high flatness and stability on mechanical holders (substrates), this arrangement has the disadvantage that the strength and thus long-term stability of the holder/substrate is weakened. Moreover, during the mounting of membrane wafers with micro-optical structures, it is often necessary to adhesively bond them only at points, as a result of which the efficacy of such a layer is restricted from the outset. A similar arrangement and method are described in U.S. Pat. No. 8,754,505 B2. Here, too, the same disadvantages with regard to the supporting/mounting of membrane wafers are manifested.

DISADVANTAGES OF THE PRIOR ART

The curing of the adhesive at high temperatures results in an undesired warpage of the wafer and thus a warpage of the membranes or a displacement of the membranes with respect to one another.

It is an object of the invention, on the basis of the disadvantages of the prior art, to provide a method for producing an optical element comprising one or a plurality of micro-optical structures on a thin membrane, wherein, in the case of one membrane, the latter itself has very little unevenness and, in the case of a plurality of membranes, the latter additionally have small height differences/unevennesses with respect to one another. The undesired warpage of the wafer and the associated warpage of the membranes or displacements of the membranes with respect to one another are intended to be prevented or at least reduced.

This object is achieved by means of the features of the independent claims. The dependent claims relate to advantageous configurations.

The approach presented here provides a method for producing an optical element comprising micro-optical structures, characterized in that the method comprises a step of connecting, in which a wafer as carrier basis of the micro-optical structures is connected to a carrier via an intermediate substrate, in particular with a thickness of typically 100 μm up to 10 mm, wherein the coefficients of thermal expansion of the wafer, of the intermediate substrate and of the carrier are dimensioned such that a coefficient of expansion of the carrier is greater than a coefficient of expansion of the intermediate substrate and a coefficient of expansion of the intermediate substrate is greater than or equal to a coefficient of expansion of the wafer.

A membrane can be understood to mean a structure extended in a planar fashion and having a thickness of 10 nm to a few micrometers, which is at least partly transparent to ultraviolet light, in particular extreme ultraviolet light. A micro-optical structure can be understood to mean a structure in which the dimensions of the optically effective elements are for example in the range of the wavelength of the ultraviolet or extreme ultraviolet light. A coefficient of expansion is a physical property of a material that denotes the expansion or contraction of a predetermined material when the temperature of said material changes.

The invention is based on the insight that by selecting materials having different coefficients of expansion for the carrier, the intermediate substrate and the wafer during the production of optical elements containing membranes, it is possible to produce very flat or planar membranes. This stems from the fact that connecting the carrier, the intermediate substrate and the wafer usually involves using material (adhesive) which requires an increase in the ambient temperature for the purpose of curing, as a result of which the carrier, the intermediate substrate and the wafer expand to different degrees or extents. Once the temperature decreases again, the corresponding parts contract again to different degrees, such that the carrier, having the largest coefficient of expansion, stresses the wafer adhesively bonded thereon via the intermediate substrate, such that the wafer is kept very flat or planar.

The approach presented here affords the advantage of being able to produce very flat membranes using technically very simple means by the selection of materials having expedient coefficients of expansion for the wafer, the intermediate substrate or the carrier.

An embodiment of the approach presented here is particularly expedient in which in the step of connecting, wafer, intermediate substrate and carrier are connected using an adhesive material which cures at a temperature which is higher than room temperature, in particular which cures at a temperature of at least 50° C. Such an embodiment of the approach presented here affords the advantage that the wafer, the intermediate substrate and the carrier expand greatly enough in order, upon subsequent cooling after the curing of the adhesive material, to configure a sufficiently large tensile force on the wafer, or the membrane in a sufficiently flat or planar manner.

An embodiment of the approach proposed here is furthermore conceivable in which in the step of connecting, an intermediate substrate and a wafer are connected, wherein the coefficient of expansion of the intermediate substrate is equal to a coefficient of expansion of the wafer.

An embodiment of the approach proposed here is furthermore expedient in which in the step of connecting, a surface of the wafer is produced which is planar, in particular which has a flexure of less than 1 μm. Such an embodiment of the approach proposed here affords the advantage of the least possible optical distortion of the micro-optical structure upon transilluminating the membrane with ultraviolet or extreme ultraviolet light.

An embodiment of the approach proposed here is technically particularly simple in which, in the step of connecting, a membrane carrier is connected to the intermediate substrate, said carrier at least partly comprising silicon, in particular said carrier being produced from silicon. Such an embodiment of the approach presented here affords the advantage of using a widely and cost-effectively available silicon wafer as carrier in accordance with the nomenclature used here.

In accordance with a further embodiment of the approach proposed here, in the step of connecting, a wafer and/or an intermediate substrate can be used which at least partly comprise(s) silicon nitride, in particular which consist(s) of silicon nitride.

An embodiment of the approach proposed here is furthermore conceivable as an arrangement for producing an optical element comprising micro-optical structures, consisting of a wafer as carrier basis of the micro-optical structures, an intermediate substrate and a carrier, which are connected to one another, and the coefficients of thermal expansion of which are dimensioned such that the coefficient of expansion of the carrier is greater than that of the intermediate substrate and the intermediate substrate has a coefficient of expansion which is greater than or equal to the coefficient of expansion of the wafer.

At the same time, the approach presented here presents an embodiment as a membrane unit comprising micro-optical structures, which comprises a wafer as carrier basis of the membrane, which for its part is in turn the carrier of the micro-optical structures, an intermediate substrate connected to the wafer, and a carrier, connected to the intermediate substrate, wherein the coefficients of thermal expansion of the wafer, of the intermediate substrate and of the carrier are dimensioned such that a coefficient of expansion of the carrier is greater than a coefficient of expansion of the intermediate substrate and the coefficient of expansion of the intermediate substrate is greater than or equal to a coefficient of expansion of the wafer.

Advantageous exemplary embodiments of the present invention are described in greater detail with reference to the following drawings, in which:

FIG. 4 shows an illustration of a possible arrangement or membrane which was produced in accordance with an approach presented here; and FIG. 5 shows a flow diagram of one exemplary embodiment of the present invention as a method.

Figure 1:
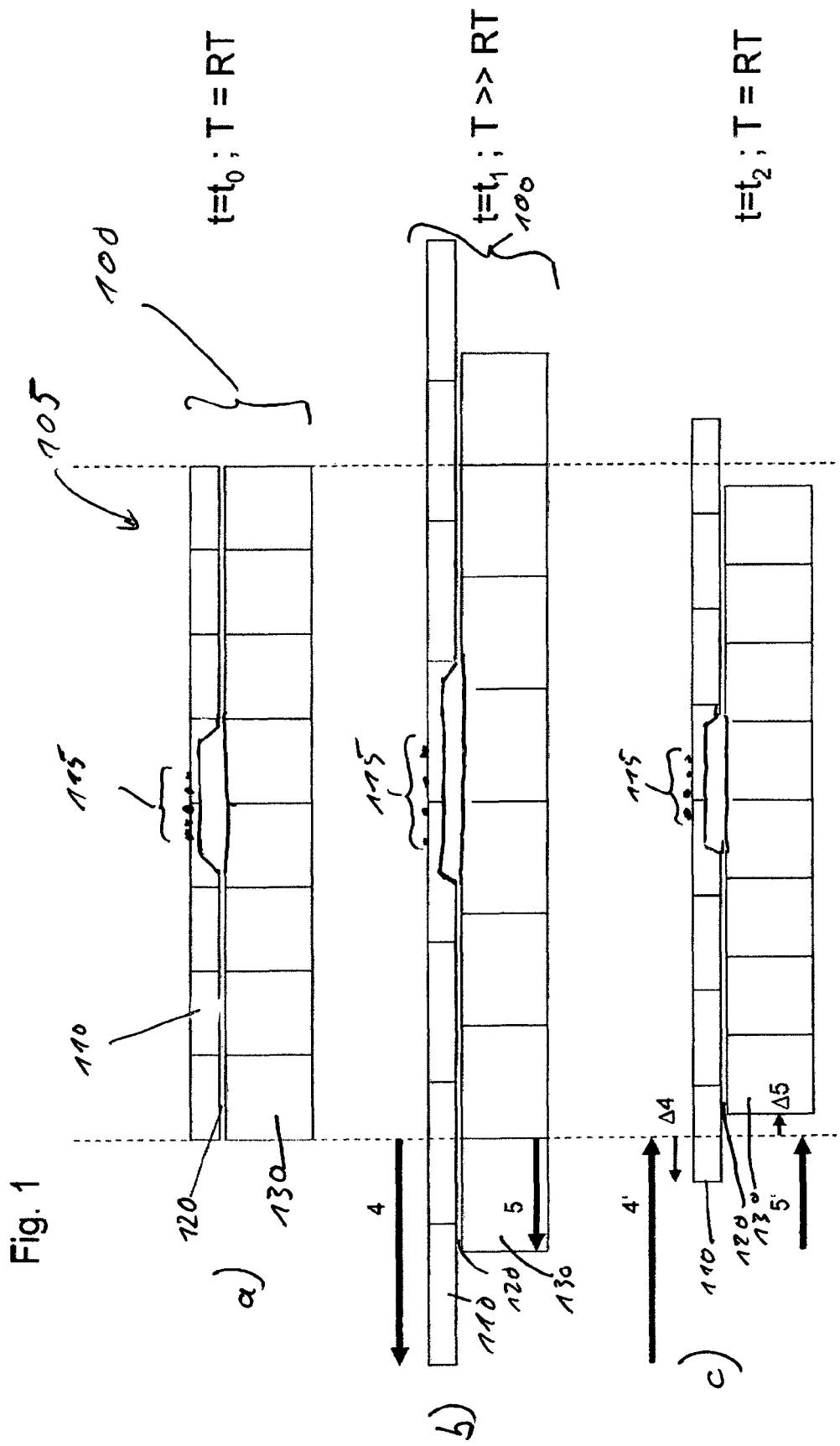
FIG. 1 shows an illustration of a principle of the arising of tensile and compressive stresses in the course of curing of the adhesive at relatively high temperatures.

In the description below, identical or similar or similarly acting elements are designated by identical or similar reference signs, a repeated description of these elements being dispensed with for the sake of clarity.

The (carrier) membranes are often produced from $Si_3N_4$, which is applied as a thin film on a Si wafer, after which the silicon of the wafer or carrier itself is then removed in a dry- or wet-chemical method, such that only the thin (~100 nm thick) membrane produced in this way remains, which is held at its edge by the wafer. By means of suitable process control during the coating of the wafer, a high flatness of the self-supporting membrane, provided that the wafer carrying the membrane is flat, can be ensured. This manner of production necessitates the use of thin substrates/wafers (thickness typically ≤1 mm), since, firstly, the etching times for thicker substrates increase very greatly and, secondly, thicker substrates often mean the restriction of the geometrically possible diffractive structures.

These wafers with optically active membranes (membrane wafers for short) should have a high flatness, in order to be able to fulfil specific optical functions. Since they have a low mechanical stability primarily against warpage on account of their small thickness, they should often be applied to stable holders, in order to be able to integrate them into optical systems. This applying can be done in various ways, e.g. by means of adhesives or else so-called "bonding".

The last-mentioned method involves introducing a reactive intermediate layer e.g. between the membrane wafer and the carrier, said intermediate layer subsequently enabling a permanent connection by means of an exothermic reaction. DE 10 2009 006 822 A1 additionally describes how said reactive intermediate layer can also be structured, such that the connection can be implemented in a spatially delimited manner. One disadvantage of this method is that the reactive intermediate layer or the intermediate layer after reactive bonding has a constant thickness. That also means, however, that the thickness variation of the wafer (total thickness variation—TTV), which is almost always greater than 1 µm, is translated directly into an unevenness of the wafer surface. The same also applies to an already existing unevenness of the substrate surface.

In order to avoid the abovementioned disadvantages of bonding, the membrane wafer can be adhesively bonded onto the carrier (or more generally a substrate), wherein the adhesive layer can in this case compensate for the TTV of the wafer and the unevenness of the substrate/carrier. In order to achieve the desired flatness of the membrane wafer, the latter is usually sucked against a very flat surface on its top side (a so-called vacuum chuck) and then adhesively bonded to the substrate.

In order to achieve the final strength of the adhesive, so-called "curing" of the adhesive is usually necessary, which either by irradiation with ultraviolet light (UV) or by heating to temperatures that are significantly higher than room (and thus the processing) temperature. In this case, UV-curing adhesives can be used only if at least either the wafer to be adhesively bonded or the substrate/carrier structure is transparent to UV. This does not apply to most membrane wafers since, as described above, they consist of silicon. The substrates/carriers are often composed of ceramic materials and thus likewise non-transparent to UV. Adhesives which cure at higher temperatures are often used in these cases.

The following takes place during curing: the wafer and the substrate expand in accordance with their specific coefficients of thermal expansion (Coefficient of Thermal Expansion—for short: CTE). In the case of different materials (and thus different corresponding coefficients of expansion, CTEs), a stress or compression arises here in the adhesive, which the latter can partly compensate for, however, since it has not yet fully cured, i.e. reached its final strength. The adhesive cures in this state, that is to say that it is very much less able to compensate for the stress on account of the different negative expansion owing to the cooling. Therefore, this results in a warpage of the wafer/substrate system and thus a deterioration in the flatness of the wafer surface (the effect is similar to the "bimetal" effect). This in turn has the consequence that the micro-optical (diffractive) structures can no longer be held with the necessary accuracy or alignment/parallelism with respect to one another in the optical system.

FIG. 1 shows, in subfigures 1a to 1c, illustrations of a layer composite 100 for producing an optical element 105 at different temperatures during the step of connecting the wafer 110 using an adhesive material 120 and the carrier 130, an intermediate substrate not yet being used. In this case, the membrane wafer 110 comprises diffractive or micro-optical structures 115, which, in an optical element 105 subsequently processed to completion, bring about a predetermined diffraction or refraction of EUV or UV light incident on said structures 115 in order to obtain a desired field distribution at a desired location in the optical system. The membrane is usually situated only directly below the micro-optical structures 115 and is much smaller than the wafer 110 or the entire assembly or the layer composite 100. The coefficient of thermal expansion $CTE_1$ of the wafer 110 and the coefficient of expansion $CTE_2$ of the carrier 130 are dimensioned such that the coefficient of thermal expansion $CTE_2$ of the carrier 130 is greater than or equal to the coefficient of expansion $CTE_1$ of the wafer 110. The parts of the optical element 105, that is to say the wafer 110 and the carrier 130, are connected using an adhesive 120 or adhesive material which cures at temperatures which are significantly higher than room temperature. In this case, significantly higher temperatures are understood to mean, in particular, temperatures of more than 50 degrees Celsius, in particular more than 80 degrees Celsius.

If, in a curing step at a starting instant $t=t0$ at which the layer composite 100 is at room temperature RT (as is illustrated in FIG. 1a), heating to a temperature T that is significantly greater than room temperature is then effected, at an instant t1 subsequent to the starting instant t0 the wafer 110 expands by the length magnitude 4, whereas the carrier expands only by a length magnitude 5. The dimensions of the individual components of the layer composite 100 at the instant t1 are illustrated here in FIG. 1b. In this situation, the adhesive 120 can cure and fix the wafer 110 and the carrier 130 in the corresponding positions relative to one another.

Once the layer composite 100 then cools again, for example to room temperature RT at the instant t2, the individual components of the semifinished product 105, that is to say the wafer 110 and the carrier 130, contract to different degrees, as is illustrated in FIG. 1c. The individual components of the layer composite 100, that is to say the wafer 110 and the carrier 130, should contract back here by respectively the same magnitude 4' and 5' as in the case of heating to the increased temperature at the instant t1, but this is no longer possible as a result of the fixing after the curing of the adhesive. In comparison with the expansion of the components wafer 110 and carrier 130, therefore, the wafer 110 is lengthened by the magnitude Δ4 after cooling, whereas the carrier 130 has been shortened by the magnitude Δ5. As a result, a tensile stress of the wafer 110 arises as a result of the fixing on the carrier 130, which has the consequence that the wafer 110 with the micro-optical structures 115 applied thereon is warped.

Figure 2:
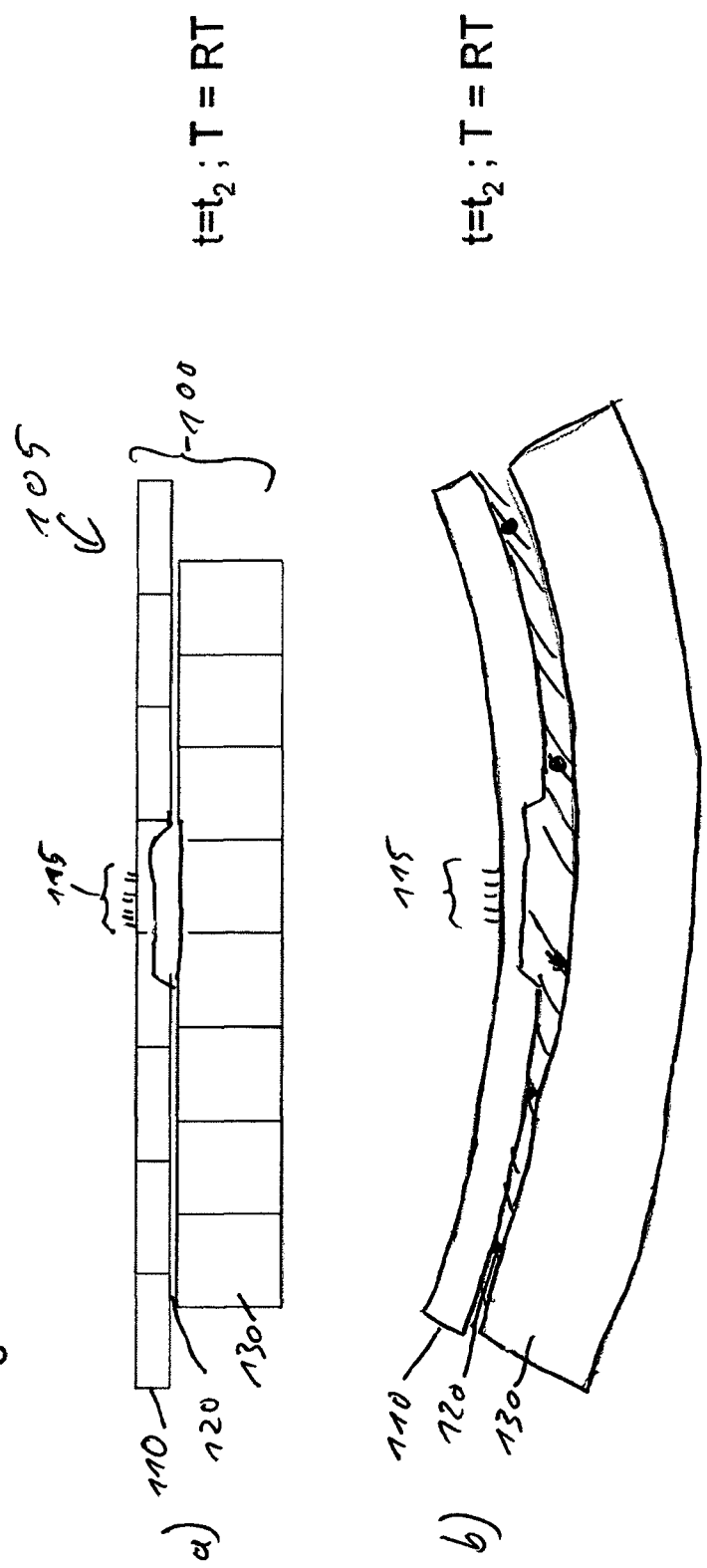
FIG. 2 shows an illustration of how the stresses shown in FIG. 1 lead to a warpage of the composite system comprising carrier and wafer and thus to a deterioration in the flatness of the membranes.

FIG. 2 shows, in two subfigures 2a and 2b, an illustration of a flexure of the arrangement of the components 110 and 130 of an optical element 105, in which the (membrane) wafer 110 was adhesively bonded to the substrate or carrier 130. It is evident here that in the case of an adhesive bonding using the different coefficients of thermal expansion in accordance with the illustration from FIG. 2a, this leads to a layer composite 100 corresponding to the illustration from FIG. 1c. However, if only a conventional adhesive bonding is inserted, after the adhesive bonding at the instant t2 a layer composite 100 exhibiting flexure results, as is illustrated in FIG. 2b, and wherein the micro-optical structures 115 are no longer optimally usable as a result of the uncontrolled flexure of the layer composite 100. FIG. 2 thus shows that the tensile stress of the wafer 110 or the compressive stress of the substrate 130 results in a warpage of the entire arrangement and thus in a deterioration of the surface flatness of the membrane of the wafer 115. This warpage as a result of the tensile and compressive stresses arising as in FIG. 1 is shown in FIG. 2. The deterioration in the flatness of the membrane wafer follows directly from the warpage of the layer composite.

Figure 3:
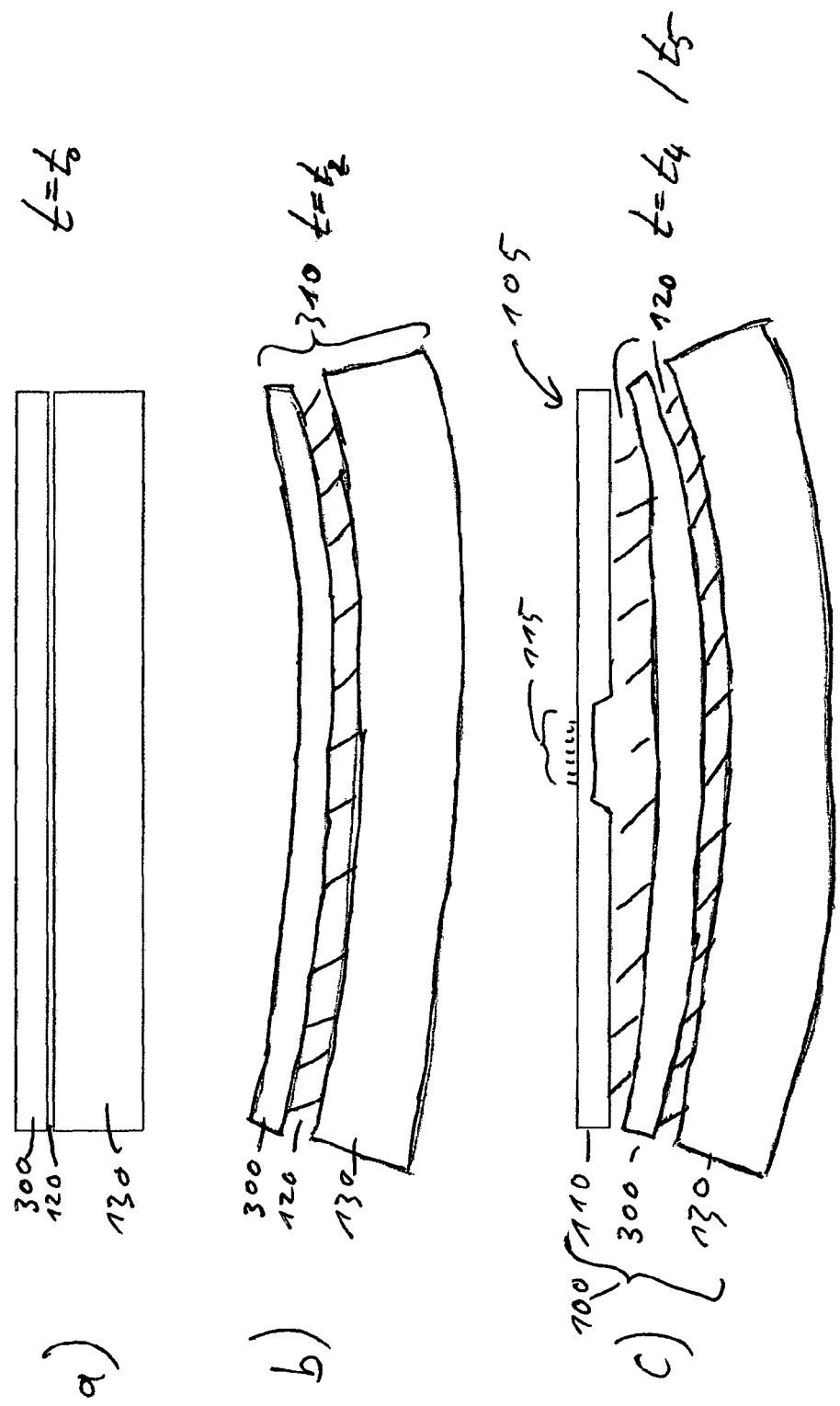
FIG. 3 shows illustrations of individual steps of the production of one exemplary embodiment of the membrane arrangement presented here.

FIG. 3 shows, in subfigures 3a to 3c, illustrations of individual steps of the production of one exemplary embodiment of the optical element 105 presented here. In this case, firstly, in accordance with the illustration from FIG. 3a, at an instant t0, the intermediate substrate 300 is adhesively bonded in a flat fashion onto the carrier 130—produced in a flat fashion—as first substrate using the adhesive material 120 and is then subjected to temperature regulation by temperature increase, such that at the instant t2 a first part 310 in accordance with the illustration from FIG. 3b results, in which the adhesive-bonding connection has cured. As intermediate substrate 300 it is possible to use a material, for example, which has a coefficient of expansion $CTE_z$ which is less than the coefficient of expansion of the carrier yet also greater than or equal to a coefficient of expansion of the wafer. The intermediate state shown in FIG. 3b corresponds to the final state shown in FIG. 2b. Then, in accordance with one advantageous exemplary embodiment, the intermediate substrate 300 can be leveled and the wafer 110 as second substrate can be adhesively bonded onto the first part 310 (for example once again using the adhesive material 120 used previously), after which the adhesive material is cured again. A further possibility is for the bent/uneven surface of the intermediate substrate 300 to be left and for the adhesive 120 to fill the adhesive-bonding gap of varying thickness/width. What can then be achieved in this way is that the wafer 110 adhesively bonded on the intermediate substrate is held flat and, by virtue of the insertion of an intermediate substrate 300, is no longer warped, even if a hot-curing adhesive is used.

The approach proposed here thus describes an arrangement consisting of the membrane wafer 110 (as carrier basis of the micro-optical structures 115), an intermediate substrate 300 and a carrier 130, wherein their coefficients of thermal expansion (CTEs) are dimensioned such that the coefficient of expansion CTE2 of the carrier 130 is greater than that of the intermediate substrate 300 and the intermediate substrate 300 has a coefficient of expansion CTEZ which is greater than or equal to the coefficient of expansion CTE1 of the wafer 110 (but less than CTE1 of the carrier 130). All three parts 110, 300 and 130 are connected using adhesive 120 which cures at temperatures which are significantly higher than room temperature. Significantly higher temperatures are understood here to mean, in particular, temperatures of more than 50 degrees Celsius, in particular more than 80 degrees Celsius.

As a result of the described choice of the coefficients of thermal expansion, a tensile stress is generated in the membrane wafer 110, which results in an improvement of the flatness of the membranes 105 produced subsequently and thus of the micro-optical structures 115.

Even with the same CTE, a better flatness results since the "CTE mismatch" already leads to warpage on the surface of the intermediate substrate, and afterward, upon curing of the second adhesive-bonding connection, does not additionally warp the wafer 110 on account of the correspondence of the CTEs.

In this respect, an arrangement is described which in particular is characterized in that an intermediate substrate having a material-specific intermediate coefficient of thermal expansion CTEz is adhesively bonded onto a first substrate having a material-specific first coefficient of thermal expansion CTE1 and a second substrate having a material-specific second coefficient of thermal expansion CTE2 is adhesively bonded on said intermediate substrate, wherein the first coefficient of thermal expansion CTE1 is less than the intermediate coefficient of thermal expansion and the intermediate coefficient of thermal expansion is less than or equal to the second coefficient of thermal expansion, that is to say that CTE1<CTEz≤CTE2 holds true. It is furthermore disclosed that the abovementioned components can be connected particularly advantageously using a hot-curing adhesive and/or that, in one expedient exemplary embodiment, the intermediate coefficient of thermal expansion is equal to the second coefficient of thermal expansion, that is to say that the following holds true: CTEz=CTE2. Additionally or alternatively, the membrane should be very flat or planar and/or the membrane wafer 110 should comprise or consist of silicon.

FIG. 4 shows an illustration of an optical element 105 that was produced in accordance with an approach presented here. In this case, the wafer 110 is produced from $Si_3N_4$ at least in a sublayer 405 and comprises an absorber layer 400, into which are embedded the diffractive or micro-optical structures 115, which are formed for example by openings in the absorber layer. However, it is also conceivable that any other silicon nitride, that is to say $Si_xN_y$, can be used instead of the $Si_3N_4$. The absorber layer 400 can for example consist of chromium Cr or contain this element. The micro-optical structures 115 can be formed as through-etchings 410 through the absorber layer and/or the $Si_3N_4$ layer on a silicon carrier 415. In the region of the micro-optical structures 115, the wafer 130 is structured, for example by means of a wet or dry etching step that is well known from semiconductor technology, in such a way that said wafer has in this region 420 an opening or cutout through which, as viewed from an opposite side of the carrier 130 relative to the $Si_3N_4$ layer, the micro-optical structures 115 are exposed. In the exemplary embodiment of the optical element 105 in accordance with FIG. 4, the intermediate substrate 300 is arranged below the wafer 110 and fixed to the wafer 110 by means of an adhesive material 120. The intermediate substrate 300 is for example thinner than the membrane wafer 110 and can for example likewise consist of a silicon material and then has the same coefficient of expansion as the wafer or the silicon carrier 415 of the wafer. Furthermore, the wafer 110 and the intermediate substrate 300 fixed to the wafer 110 are applied on the carrier 130 or adhesively bonded using the adhesive material 120, which carrier can consist of a silicon carbide carrier or at least partly comprises silicon carbide or SiSiC. As a result, it is possible to produce an optical element 105 with an edge made from the material of the carrier 130, the surface 430 of which has a very small flexure of, for example, less than 1 μm in the region of the micro-optical structures 115. To put it another way, a very great flatness or planar surface 430 can be ensured in the case of such a membrane 105.

FIG. 5 shows a flow diagram of one exemplary embodiment of the present invention as a method 500 for producing an optical element 105 comprising micro-optical structures 115. The method 500 comprises a step 510 of connecting, in which the wafer 110 as a carrier of the micro-optical structures 115 is connected to a carrier 130 via an intermediate substrate 300, wherein the coefficients of thermal expansion of the wafer 110, of the intermediate substrate 300 and of the carrier 130 are dimensioned such that a coefficient of expansion of the carrier 130 is greater than a coefficient of expansion of the intermediate substrate 300 and the coefficient of expansion of the intermediate substrate 300 is greater than or equal to a coefficient of expansion of the wafer 110. In this case, in accordance with one particularly expedient exemplary embodiment, the step of connecting 510 comprises a plurality of substeps. By way of example, a first substep 520 can involve adhesively bonding the intermediate substrate 300 onto the carrier 130 using an adhesive material 120. In a subsequent step 530 of curing, the adhesive material 120 can be cured, for example using temperature regulation or heating of the carrier 130, the intermediate substrate 300 and the adhesive material 120 connecting the two components. Afterward, once again in a further optional substep 540 of leveling, the intermediate substrate 300 can be polished in order to obtain a flat surface of the composite 310 comprising wafer 130 and intermediate substrate 300. Afterward, a subsequent substep 550 can involve adhesively bonding the wafer 110 onto the composite 310 comprising intermediate substrate 300 and carrier 130, for example once again using the adhesive material 120 from the previous substep 520 of adhesive bonding. Finally, a subsequent substep 560 can involve curing the adhesive material 120 between the wafer 110 and the composite 310 comprising intermediate substrate 300 and carrier 130. In this way, it is possible to produce an optical element 105 which has a very flat or planar surface of the wafer 110 or of the membrane of the wafer 110.

The invention claimed is:

1. A method for producing an optical element comprising micro-optical structures, wherein the method comprises a step of connecting, in which a wafer having the micro-optical structures is connected to a carrier via an intermediate substrate, wherein the coefficients of thermal expansion of the wafer, the intermediate substrate and the carrier are dimensioned such that a coefficient of expansion of the carrier is greater than a coefficient of expansion of the intermediate substrate and the coefficient of expansion of the intermediate substrate is greater than or equal to a coefficient of expansion of the wafer, and wherein, in the step of connecting, the wafer is connected to the intermediate substrate by an adhesive material that cures at a temperature which is higher than room temperature.

2. The method as claimed in claim 1, wherein in the step of connecting, the intermediate substrate and the carrier are connected using the adhesive material which cures at a temperature which is higher than room temperature.

3. The method as claimed in claim 2, wherein the step of connecting further comprises a substep of adhesive bonding, a substep of curing, a substep of leveling, a substep of further adhesive bonding and a substep of further curing, wherein in the substep of adhesive bonding, the intermediate substrate is adhesively bonded onto the carrier using the adhesive material, in the substep of curing, the adhesive material is cured, in the substep of leveling, a surface of the intermediate substrate is leveled, in the substep of further adhesive bonding, the wafer is adhesively bonded onto a composite comprising the carrier and the intermediate substrate using the adhesive material, and in the substep of further curing, the adhesive material between the wafer and the intermediate substrate of the composite is cured.

4. The method as claimed in claim 3, wherein in the substep of leveling, the surface of the intermediate substrate is leveled by polishing.

5. The method as claimed in claim 1, wherein in the step of connecting, the intermediate substrate and the wafer are connected, wherein the coefficient of expansion of the intermediate substrate is equal to a coefficient of expansion of the wafer.

6. The method as claimed in claim 1, wherein in the step of connecting, a surface of the wafer is produced which has a flexure of less than 1 μm.

7. The method as claimed in claim 1, wherein in the step of connecting, the carrier is connected to the intermediate substrate, the carrier at least partly comprising SiC and/or SiSiC.

8. The method as claimed in claim 1, wherein in the step of connecting, the wafer used which at least partly comprises silicon nitride.

9. The method as claimed in claim 1, wherein in the step of connecting, the adhesive material cures at a temperature of at least 50° C.

10. The method as claimed in claim 1, wherein the wafer consists of silicon nitride.

\* \* \* \* \*